United States Patent [19]

Cottrell et al.

[11] Patent Number: 4,480,375
[45] Date of Patent: Nov. 6, 1984

[54] SIMPLE PROCESS FOR MAKING COMPLEMENTARY TRANSISTORS

[75] Inventors: Peter E. Cottrell; Henry J. Geipel, Jr., both of Essex Junction, Vt.

[73] Assignee: International Business Machines Corporation, Armonk, N.Y.

[21] Appl. No.: 448,124

[22] Filed: Dec. 9, 1982

[51] Int. Cl.³ ............... H01L 21/22; H01L 29/78; H01L 21/263

[52] U.S. Cl. ..................... 29/576 B; 29/571; 148/1.5; 148/187; 357/42; 357/91

[58] Field of Search ............ 29/576 B, 571; 148/1.5, 148/187; 357/42, 91

[56] References Cited

U.S. PATENT DOCUMENTS

| | | | |
|---|---|---|---|
| 4,135,955 | 1/1979 | Gasner et al. | 148/187 |
| 4,139,402 | 2/1979 | Steinmaier et al. | 148/188 |
| 4,277,291 | 7/1981 | Cerofolino et al. | 148/1.5 |
| 4,295,266 | 10/1981 | Hsu | 29/571 |
| 4,306,916 | 12/1981 | Wollesen et al. | 148/1.5 |
| 4,382,827 | 5/1983 | Romano-Moran et al. | 148/1.5 |
| 4,385,947 | 5/1983 | Halfacre et al. | 148/187 |
| 4,391,650 | 7/1983 | Pfeifer et al. | 148/1.5 |

Primary Examiner—Upendra Roy
Attorney, Agent, or Firm—Stephen J. Limanek

[57] ABSTRACT

A very simple process is provided, with reduced processing time, for making a CMOS structure using a single polysilicon, or other refractory metal, layer which includes forming a thin gate oxide on both N and P type semiconductor layers of a common substrate, forming a gate electrode simultaneously on the N type and on the P type layers and selectively implanting an N type impurity to form N+ source and drain regions in the P type layer. The semiconductor layers are then oxidized to form substantially thicker oxide, such a silicon dioxide, adjacent to the sides of the gate electrode over the P type layer than the thickness of the oxide adjacent to the sides of the gate electrode over the N type layer. Without using a mask, a P type impurity is implanted into the N type layer to form P+ source and drain regions.

17 Claims, 6 Drawing Figures

SIMPLE PROCESS FOR MAKING COMPLEMENTARY TRANSISTORS

DESCRIPTION

1. Technical Field

This invention relates to a simple process for making integrated semiconductor structures and, more particularly, to a process for making an array of transistors in the complementary metal oxide semiconductor (CMOS) technology wherein both N and P channel transistors are formed on a common semiconductor substrate.

2. Background Art

It is well known that the CMOS technology provides certain advantages over integrated semiconductor technologies that use only N channel devices or P channel devices. Some of these advantages include speed and virtually no standby power.

Processes for providing CMOS devices are taught in, e.g., U.S. Pat. Nos. 4,002,501, filed June 16, 1975, and 4,183,134, filed Dec. 11, 1978. These patents teach processes for making complementary devices which have controlled channel lengths and low gate overlap capacitance by the use of thick insulators over their source and drain regions. Other processes and structures known in the CMOS technology are taught in U.S. Pat. No. 4,045,250, filed Aug. 4, 1975, which discloses a process for producing a CMOS structure having a process step wherein a single oxidation step grows relatively thick isolation and source/drain passivation concurrently, in U.S. Pat. No. 3,700,507, filed Oct. 21, 1969, which discloses a method of making CMOS structures with a reduced number of heat treatment steps and in U.S. Pat. No. 4,244,752, filed Mar. 6, 1979, which teaches a method of making a CMOS structure using a single polysilicon layer to form the gate electrodes for both P and N channel devices.

In commonly assigned U.S. patent application having Ser. No. 352,990, filed on Feb. 26, 1982, by S. Dash et al. now U.S. Pat. No. 4,399,605, there is described a method of making complementary field effect transistors in a semiconductor layer formed on an insulator having a first portion which includes an N type transistor with a channel region defined by N+ source and drain regions and having a second portion including a P type transistor with a channel region defined by P+ source and drain regions. An insulating layer is disposed over the first and second portions with thin insulating films formed only over the channel regions. The method includes applying a photoresist layer over the insulating layer with an opening over one of the thin insulating films, introducing a first impurity into the channel region of the one portion to adjust the impurity therein and depositing a first conductive material on the thin insulating film located over the channel region of the one portion. The photoresist layer is then removed and a second impurity is introduced into the channel region of the other portion to adjust the impurity therein. A second conductive material is deposited on the thin insulating film located over the channel region of the other portion and in contact with the first conductive material, with the second conductive material having a different work function than that of the first conductive material. The first conductive material is, preferably, platinum silicide while the second conductive maerial may be aluminum.

In another commonly assigned U.S. patent application having Ser. No. 446,793, entitled, "Method of Making High Density Complementary Transistors", filed by H. J. Geipel, Jr., R. R. Troutman and J. M. Wursthorn on Dec. 3, 1982, there is described a method of making complementary field effect transistors in an N type conductivity semiconductor layer which includes forming a well having a P type conductivity in the semiconductor layer and forming first and second N type conductivity regions defining a channel region within the well. A P type conductivity region is then formed within the well surrounding the first and second N type conductivity regions and the channel region, followed by the formation of a P channel device in the semiconductor layer outside of the P type well.

In yet another commonly assigned U.S. patent application having Ser. No. 448,125, entitled, "Process for Making Complementary Transistors", filed by P. E. Cottrell, H. J. Geipel, Jr. and D. M. Kenney, on Dec. 9, 1982, there is taught a process for making a planar CMOS structure with tight geometries which has well and field regions self-aligned to each other after the active device regions have been defined.

That process provides for making a planar CMOS structure wherein isolation regions required by bulk CMOS structures are first formed, an N type well region is self-aligned to an N channel field region in a semiconductor substrate and a polysilicon layer is twice defined for forming P and N channels, the first definition masking P channel source and drain regions while defining the N channel and the second definition defining the P channel while using a photoresist layer to mask the N channel. A single mask level defines the well region and self-aligns the necessary field doping to the well region to provide closely spaced N and P channel devices.

DISCLOSURE OF THE INVENTION

It is an object of this invention to provide a very simple process for making a planar CMOS structure with improved channel length tracking, a minimum number of masking steps and minimum gate-to-diffusion overlap capacitance for the P channel device.

In accordance with the teachings of this invention, a very simple process is provided, with reduced processing time, for making a CMOS structure using a single polysilicon, or other refractory metal, layer which includes forming a thin gate oxide on both N and P type semiconductor layers of a common substrate, forming a gate electrode simultaneously on the N type and on the P type layers and selectively implanting an N type impurity to form N+ source and drain regions in the P type layer. The semiconductor layers are then oxidized to form substantially thicker oxide, such a silicon dioxide, adjacent to the sides of the gate electrode over the P type layer than the thickness of the oxide adjacent to the sides of the gate electrode over the N type layer. Without using a mask, a P type impurity is implanted into the N type layer to form P+ source and drain regions. By growing the relatively thick oxide over the N+ source and drain regions and controlling the intensity of the P+ impurity implant, the N+ source and drain regions are not adversely affected by the P+ implant and the P+ source and drain may be formed with deeper diffusion regions allowing a lower diffusion resistance which reduces the resistance in series with the active P channel device and with reduced lateral extent under the actual gated device region.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
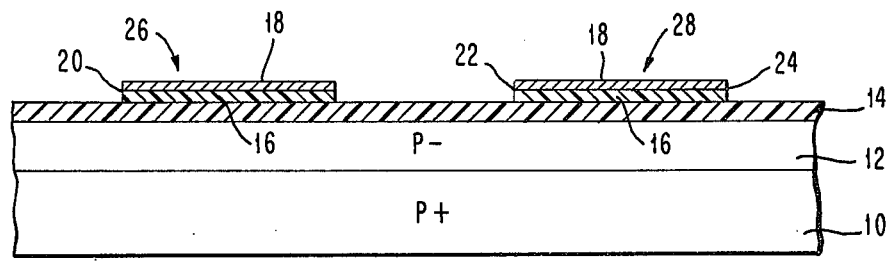
FIGS. 1-6 are sectional views of the CMOS structure made after successive steps during the process of the present invention.
Figure 2:
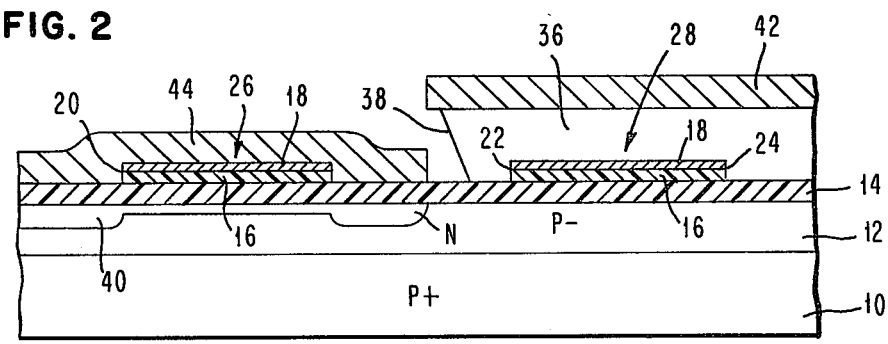
Figure 3:
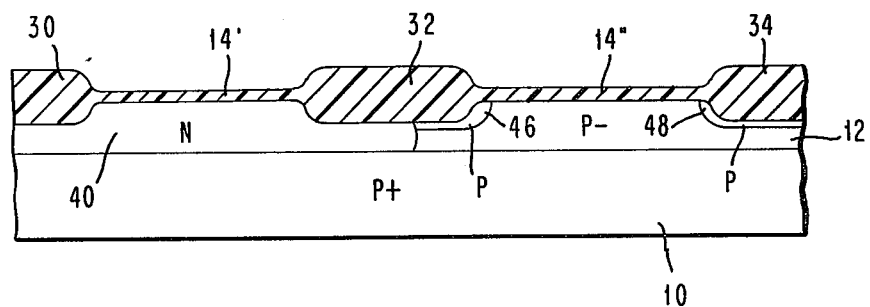

Referring to the drawings in more detail, there is illustrated in FIGS. 1, 2 and 3 sectional views of the CMOS structure made after successive steps during early stages of the process, which are similar to the views disclosed in the hereinabove referenced P. E. Cottrell et al. patent application, and in FIGS. 4, 5 and 6 sectional views of the CMOS structure made after successive steps during later stages of the process to which the present invention more specifically pertains.

In FIG. 1, the structure includes a semiconductor substrate 10, which is made of a P+ conductivity type silicon and an epitaxial semiconductor layer 12, preferably P— type silicon, grown on substrate 10. A thin layer of silicon dioxide 14 is grown on the epitaxial layer 12 and a layer of silicon nitride 16 is deposited, preferably by known low pressure chemical vapor deposition techniques, on the silicon dioxide layer 14. A first layer 18 of polysilicon, which may have a thickness of 150 nanometers, is deposited on the silicon nitride layer 16 by any known technique, preferably, by undoped low pressure chemical vapor deposition. The thickness of the epitaxial silicon layer 12 may be from 1 to 15 micrometers and have a resistivity range from 5 to 50 ohm-centimeters, and the layers 14 and 16 may have a thickness of 40 and 100 nanometers, respectively.

With a first conventional photoresist mask, not shown, openings 20, 22 and 24 are formed in the polysilicon and silicon nitride layers 16 and 18 to define pads 26 and 28 for semi-recessed oxide segments 30, 32 and 34, illustrated in FIG. 3 of the drawings. The first polysilicon layer 18 and the silicon nitride layer 16 may be dry etched by the use of carbon tetrafluoride ($CF_4$) and oxygen gas. The photoresist mask is then stripped in an oxygen plasma and the surface of the remaining structure cleaned by any known process.

A second photoresist mask 36, illustrated in FIG. 2, is provided over the first polysilicon layer 18 and the exposed surfaces of the silicon dioxide layer 14 having an opening 38 to define an N well 40, wherein phosphorous ions are implanted. The edge of the mask 36, as indicated at opening 38, has a reentrant slope. A second layer of polysilicon is, preferably, directionally evaporated over the second photoresist mask 36 and into the opening 38 forming first and second polysilicon segments 42 and 44, respectively. The segment 42 of the second polysilicon layer deposited over the second photoresist mask 36 is removed, along with the second photoresist mask 36, by known lift-off techniques, and the phosphorous ions are driven deeper into epitaxial layer 12 by a known heat process in an inert atmosphere.

With the segment 44 of the polysilicon layer in place, boron is implanted into selected portions of the surface of the P— epitaxial layer 12 defined by the pad 28 and polysilicon segment 44 for providing N channel device field regions 46 and 48, indicated in FIG. 3. All remaining polysilicon is now stripped and the semi-recessed oxide regions 30, 32 and 34 are grown adjacent to thin silicon dioxide regions 14' and 14'' which have been protected by the silicon nitride layer 16 in pads 26 and 28. The pads 26 and 28 are then stripped, gate insulators, such as 14' and 14'', are regrown and a boron channel implant is performed.

Figure 4:
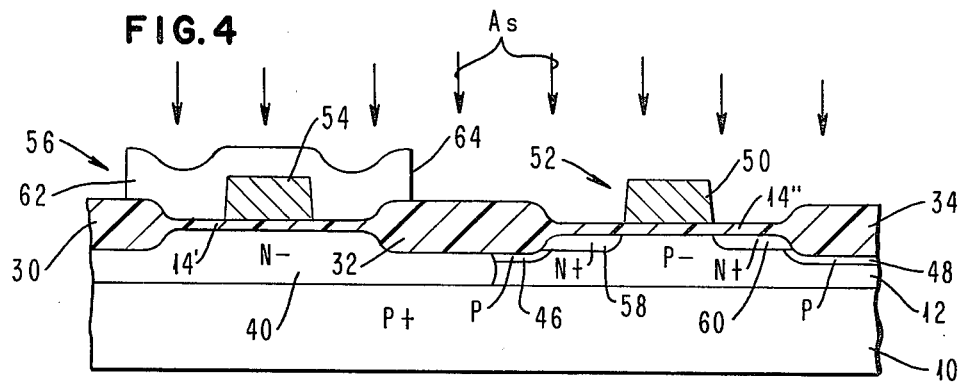

As indicated in FIG. 4 of the drawings, a third layer of doped polysilicon is deposited over the thin silicon dioxide regions 14' and 14'' and the recessed oxide regions 30, 32 and 34 and appropriately selectively etched with the use of a third photoresist mask, not shown, to form first and second polysilicon segments for use as a first gate electrode 50 of a first device 52 and a second gate electrode 54 of a second device 56. Arsenic ions As are implanted to form N+ source and drain regions 58 and 60 for the first device 52 with a photoresist mask 62 having an opening 64 protecting the N well 40. If desired, instead of depositing a third layer of polysilicon, any well known silicide or polycide, which is a combination of polysilicon and silicide, may be used. The arsenic ions may be implanted at a dose of $8 \times 10^{15}$ ions per square centimeter and an intensity of 80 KeV.

Figure 5:
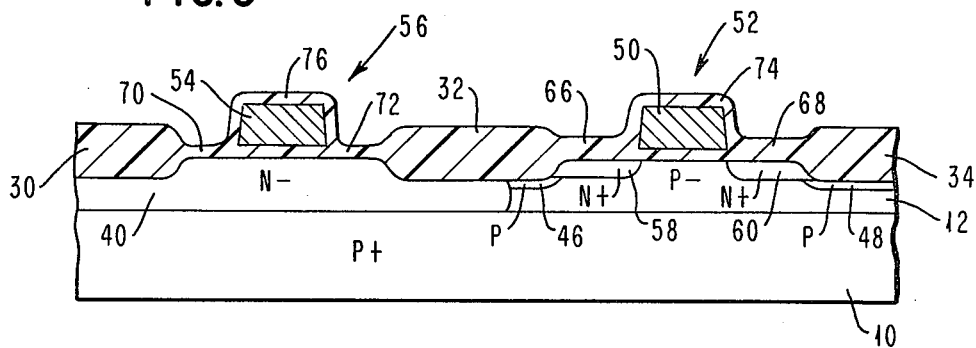

After removing the photoresist mask 62, the structure is reoxidized. Since heavily doped N+ source and drain regions 58 and 60 are disposed at the surface of the epitaxial layer 12 adjacent to the sides of the gate electrode 50 of device 52 relatively thick layers of silicon dioxide 66 and 68, as indicated in FIG. 5 of the drawings, are grown during the hereinabove described reoxidation step. It should be noted that after the reoxidation step the thickness of the layers of silicon dioxide 70 and 72 is considerably less than the thickness of silicon dioxide layers 66 and 68 since the epitaxial layer 12 under the silicon dioxide layers 70 and 72 is relatively lightly doped compared with the doping in N+ source and drain regions 58 and 60 located below the silicon dioxide layers 66 and 68. It should also be noted that during the reoxidation step layers of silicon dioxide 74 and 76 are formed over the exposed surfaces of the gate electrodes 50 and 54, respectively.

Figure 6:
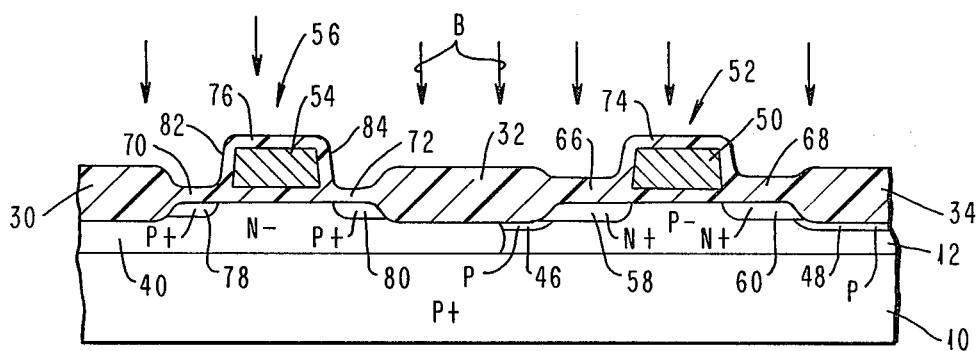

With the relatively thick layers of silicon dioxide 66 and 68 and the silicon dioxide layer 74 protecting the N+ source and drain regions 58 and 60, an implant is made so as to introduce boron ions B into regions 78 and 80 for forming the source and drain of the P channel device 56, as indicated in FIG. 6 of the drawings. It can be seen that because of the differences in thickness between silicon dioxide layers 66 and 68 and silicon dioxide layers 70 and 72, much less boron enters the N+ source and drain regions 58 and 60 than into the P+ source and drain regions 78 and 80, even though the boron implant is performed without the use of a photoresist mask. The implant energy for the boron is chosen so that the projected range $R_P$, i.e., the distance to the peak of the boron implant in a Gaussian distribution is much less than the thickness of the silicon dioxide layer 66 or 68 and yet comparable to or greater than the thickness of the silicon dioxide layers 70 or 72. The boron is implanted at, e.g., a dose of $2-5 \times 10^{15}$ ions per square centimeter and an intensity of 40-80 KeV. It has been found that after the reoxidation step and before the boron implant step, the thickness of the silicon dioxide layers 66 and 68 are at least 1.4-2.5 times the thickness of the silicon dioxide layers 70 and 72.

It can also be seen that the edges of the P+ source and drain regions 78 and 80 have been aligned with the surfaces 82 and 84 of the sidewalls of the silicon dioxide layer 76 to provide a space between the edge of the P+ region 78 and the adjacent edge of the gate electrode 54 equal to the thickness of the silicon dioxide layer 76 at the sidewall thereof. A similar space, which may be equal to 100-300 nanometers, is also provided between the edge of the P+ region 80 and the adjacent edge of the gate electrode 54. By forming the starting edges of the P+ source and drain regions at a distance from the adjacent edge of the gate electrode 54, deeper P+ diffusion regions 78 and 80 can be made to provide a lower diffusion resistance, which reduces the resistance in series with the active device 56, particularly for interconnection purposes, and the lateral extent of diffusion regions 78 and 80 under electrode 54 can be reduced.

After implanting the boron ions B into P+ source and drain regions 78 and 80, a heating step is provided to anneal and drive in the implanted ions only to the extent that any boron introduced within the highly doped N+ regions 58 and 60 during the boron ion implant be contained therein. During this annealing step, regions 78 and 80 diffuse horizontally to the edges of the gate electrode 54.

Since the edges of the P+ source and drain regions are removed from the edges of the gate electrode 54 at the start of the boron ion drive in step, the boron ions may be driven to the edges of the gate electrode 54 so that the difference between the actual gate electrode length and the effective electrical channel length of device 56 is minimal, with minimal gate capacitance formed between the gate electrode 54 and the P+ source and drain regions 78 and 80, which is critical for minimum channel length devices.

It can be seen that this technique provides a method of introducing very little, if any, 5% or less, of the P dopant into the N+ diffusion regions 58 and 60, therefore, permitting much higher P dopant levels and subsequent higher conductivity P+ regions 78 and 80 in the P channel device 56.

With the combination of the sidewall oxide and the use of a single inert thermal anneal, better short channel device characteristics are obtained permitting a P channel nominal device length substantially shorter than the corresponding N channel device length, e.g., 1.6 microns for the nominal P channel device length and 2.0 microns for the nominal N channel device length.

By employing the teaching of this invention, a P channel diffusion of 30-40 ohms per square is achievable compared to more than 100 ohms per square obtained when the vertical extent of the P dopant into the N diffusion regions 58 and 60 is not limited and significant electrical compensation occurs.

It should be noted that by using the simple process of the present invention a CMOS structure is provided with channel length tracking wherein the N channel device characteristics are not altered while the P channel device characteristics are significantly improved.

It should be understood that the polysilicon gate electrodes 50 and 54 may be made of other refractory materials, such as silicides or polycides, and that, as is known, impurities other than phosphorous, arsenic and boron may also be appropriately used. It should also be understood that the N channel and P channel (CMOS) devices are fabricated with the use of only a non-crital blocking mask 62.

While the invention has been particularly shown and described with reference to preferred embodiments thereof, it will be understood by those skilled in the art that various changes in form and details may be made therein without departing from the spirit and scope of the invention.

What is claimed is:

1. A method of making a complementary metal oxide semiconductor (CMOS) structure comprising the steps of:

forming a first oxidizable gate electrode for an N channel device on a first portion of a semiconductor substrate and a second oxidizable gate electrode for a P channel device on a second portion of said substrate, masking the second portion of said substrate, implanting N type ions into said first portion aligned with the edges of said first gate electrode to form source and drain regions for said N channel device, removing the masking material from said second portion, oxidizing the surface of said substrate without said gate electrodes and the exposed surfaces of said first and second gate electrodes to form a first oxide layer on the edges of said gate electrodes, a second oxide layer over said N channel device source and drain regions and a third oxide layer over the second portion of said substrate, said second oxide layer being thicker than said third oxide layer, and introducing P type ions into the first and second portions of said substrate aligned with the edges of the oxide layers on said gate electrodes so as to form source and drain regions for said P channel device, whereby a given number of P type ions per unit area is disposed within said P channel device source and drain regions and a lesser number than said given number of P type ions per unit area is disposed within said N channel device source and drain regions.

2. A method of making a complementary metal oxide semiconductor (CMOS) structure as set forth in claim 1 wherein said lesser number of P type ions is a quantity of ions which does not significantly alter the threshold voltage characteristics of said N channel device.

3. A method of making a complementary metal oxide semiconductor (CMOS) structure as set forth in claim 1 further including oxidizing the edges of said gate electrodes simultaneously with the oxidation of said substrate without said gate electrodes.

4. A method of making a complementary metal oxide semiconductor (CMOS) structure as set forth in claim 1 wherein the oxidized substrate forms a thicker layer of insulating material above said N channel device source and drain regions than above the second portion of said substrate adjacent said second electrode.

5. A method as set forth in claim 4 wherein said first and second gate electrodes are made of an oxidizable electrically conductive refractory material, the first portion of said substrate has a P type conductivity and said second portion of said substrate has an N type conductivity.

6. A method as set forth in claim 5 wherein said refractory material is doped polysilicon, said N type ions are arsenic ions and said P type ions are boron ions.

7. A method as set forth in claim 4 wherein said substrate is made of silicon and said layer of insulating material is a layer of silicon dioxide and said gate electrodes are made of doped polysilicon.

8. A method as set forth in claim 1 wherein the second portion of said substrate is an N type conductivity well and said N well is masked by a layer of photoresist.

9. A method of making a complementary metal oxide semiconductor (CMOS) structure comprising the steps of:
forming a first oxidizable gate electrode for an N channel device on a first portion of a semiconductor substrate and a second oxidizable gate electrode for a P channel device on a second portion of said substrate,
masking the second portion of said substrate,
implanting N type ions into said first portion to form source and drain regions for said N channel device,
removing the masking material from said second portion,
oxidizing the exposed surfaces of said gate electrodes and the surface of said substrate without said gate electrodes to form a first oxide layer over said first and second gate electrodes and a second oxide layer over said N type source and drain regions and a third oxide layer over the second portion of said substrate adjacent said second gate electrode, said second oxide layer being thicker than said third oxide layer, and
introducing P type ions into said substrate aligned with the edges of said first oxide layer forming source and drain regions for said P channel device.

10. A method as set forth in claim 9 wherein a given number of P type ions per unit area are implanted into the source and drain regions for said P channel device and a substantially lesser number of P type ions per unit area than said given number are implanted into the source and drain regions of said N channel device.

11. A method as set forth in claim 10 wherein the peak of the Gaussian distribution of the implanted P type ions is within the thicker oxide formed over said N type source and drain regions.

12. A method as set forth in claim 11 wherein said P type ions are implanted into said source and drain regions of said P channel device at a given distance from the edges of said second gate electrode and subsequently driven substantially said given distance toward the edges of said second gate electrode by an annealing step.

13. A method as set forth in claim 12 wherein said P type ions are boron ions and said second oxide layer is at least approximately 1.4 to 2.5 times thicker than said third oxide layer.

14. A method as set forth in claim 12 wherein said N type ions are arsenic ions, said substrate is made of silicon and said gate electrodes are made of an oxidizable electrically conductive refractory material.

15. A method of making a semiconductor structure comprising the steps of:
forming a first oxidizable gate electrode for an N channel device on a first portion of a silicon substrate having a P type conductivity and a second oxidizable gate electrode for a P channel device on a second portion of said substrate having an N type conductivity,
masking the second portion of said substrate with a layer of photoresist,
implanting arsenic ions into said first portion to form N+ source and drain regions for said N channel device,
removing the layer of photoresist from said second portion,
oxidizing the surface of said substrate without said gate electrodes and the exposed surfaces of said gate electrodes to form insulating layers over said substrate and over said gate electrodes, and
introducing boron ions into the first and second portions of said substrate aligned with an edge of the insulating layer over said gate electrodes to form P+ source and drain regions for said P channel device, whereby a given number of boron ions per unit area is disposed within said P+ source and drain regions and a substantially lesser number than said given number of boron ions per unit area is disposed within said N+ source and drain regions.

16. A method as set forth in claim 15 wherein said gate electrodes are made of an oxidizable electrically conductive refractory material and the exposed surfaces of said gate electrodes are oxidized simultaneously with the surface of said silicon substrate.

17. A method as set forth in claim 16 wherein said gate electrode material is doped polysilicon and said insulating layers are silicon dioxide layers.

* * * * *